United States Patent
Mizutani

(10) Patent No.: US 8,525,037 B2
(45) Date of Patent: Sep. 3, 2013

(54) SUSPENSION BOARD WITH CIRCUIT AND PRODUCING METHOD THEREOF

(75) Inventor: Masaki Mizutani, Osaka (JP)

(73) Assignee: Nitto Denko Corporation, Osaka (JP)

( * ) Notice: Subject to any disclaimer, the term of this patent is extended or adjusted under 35 U.S.C. 154(b) by 60 days.

(21) Appl. No.: 13/325,815

(22) Filed: Dec. 14, 2011

(65) Prior Publication Data

US 2012/0175151 A1 Jul. 12, 2012

Related U.S. Application Data

(60) Provisional application No. 61/457,186, filed on Jan. 24, 2011.

(30) Foreign Application Priority Data

Jan. 12, 2011 (JP) ................................. 2011-004248

(51) Int. Cl.
*H05K 1/02* (2006.01)

(52) U.S. Cl.
USPC .............. 174/254; 174/135; 174/154; 439/67

(58) Field of Classification Search
USPC ...... 174/135, 154, 254, 260, 264; 360/245.9; 439/67, 951
See application file for complete search history.

(56) References Cited

U.S. PATENT DOCUMENTS

| | | | |
|---|---|---|---|
| 7,455,531 B2 * | 11/2008 | Hirabayashi et al. | 439/67 |
| 7,925,127 B2 * | 4/2011 | Ishii et al. | 385/14 |
| 8,247,699 B2 * | 8/2012 | Shen | 174/254 |
| 2010/0047626 A1 | 2/2010 | Hitomi et al. | |
| 2013/0021699 A1 * | 1/2013 | Ohsawa | 360/245.8 |

FOREIGN PATENT DOCUMENTS

| | | |
|---|---|---|
| JP | 10-027447 A | 1/1998 |
| JP | 2008-310946 A | 12/2008 |

* cited by examiner

*Primary Examiner* — Dhirubhai R Patel

(74) *Attorney, Agent, or Firm* — Jean C. Edwards, Esq.; Edwards Neils PLLC

(57) ABSTRACT

A suspension board with circuit includes a gimbal portion. The gimbal portion includes a tongue portion formed at the inner side of the opening for being mounted with a slider mounted with a magnetic head for being electrically connected to the conductive layer, an outrigger portion formed at the outer side of the opening to support the tongue portion, and a passing portion passing through the opening of the gimbal portion and/or an outer side region of the outrigger portion. The passing portion includes the conductive layer and the insulating layer covering the conductive layer. The thickness of a lower half portion of the insulating layer in the passing portion is the same as that of an upper half portion thereof.

7 Claims, 15 Drawing Sheets

FIG. 7
(a)
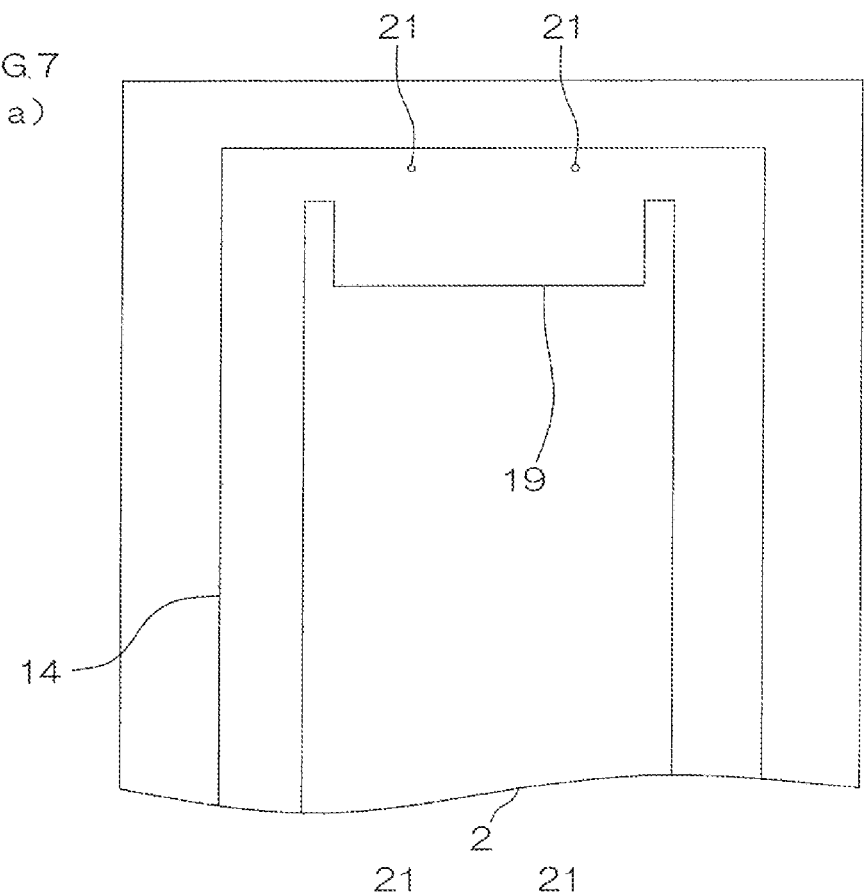
(b)
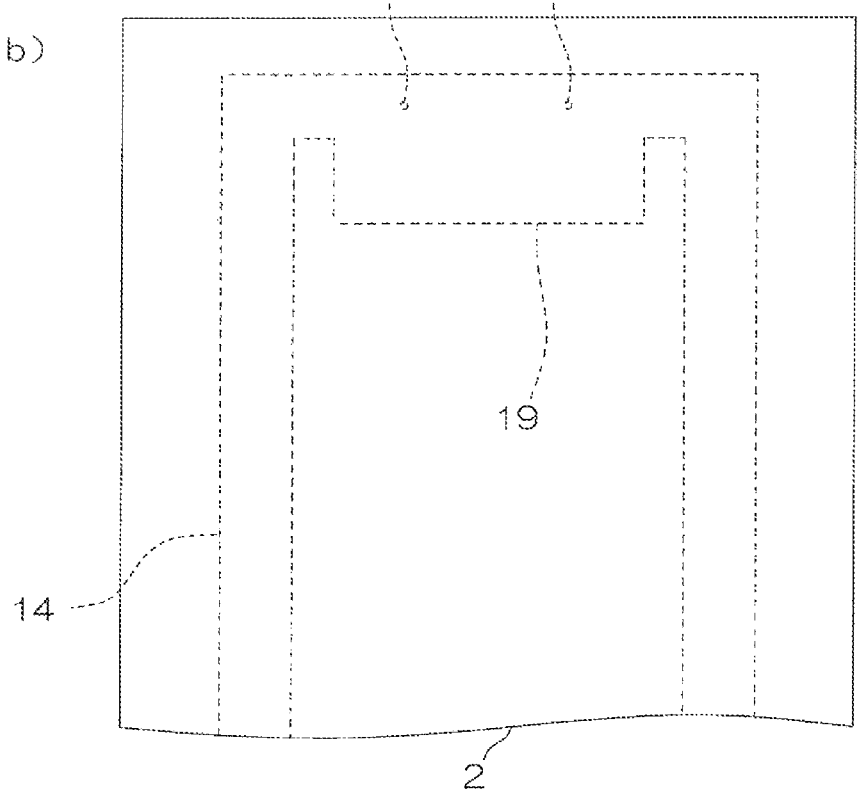

FIG.9
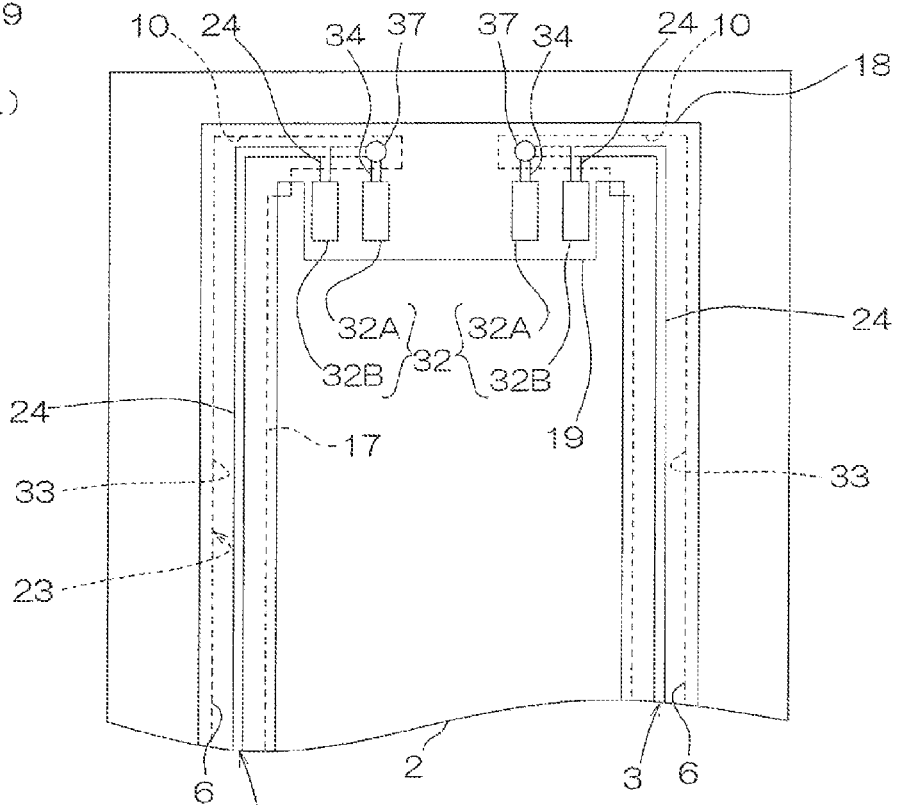
(a)
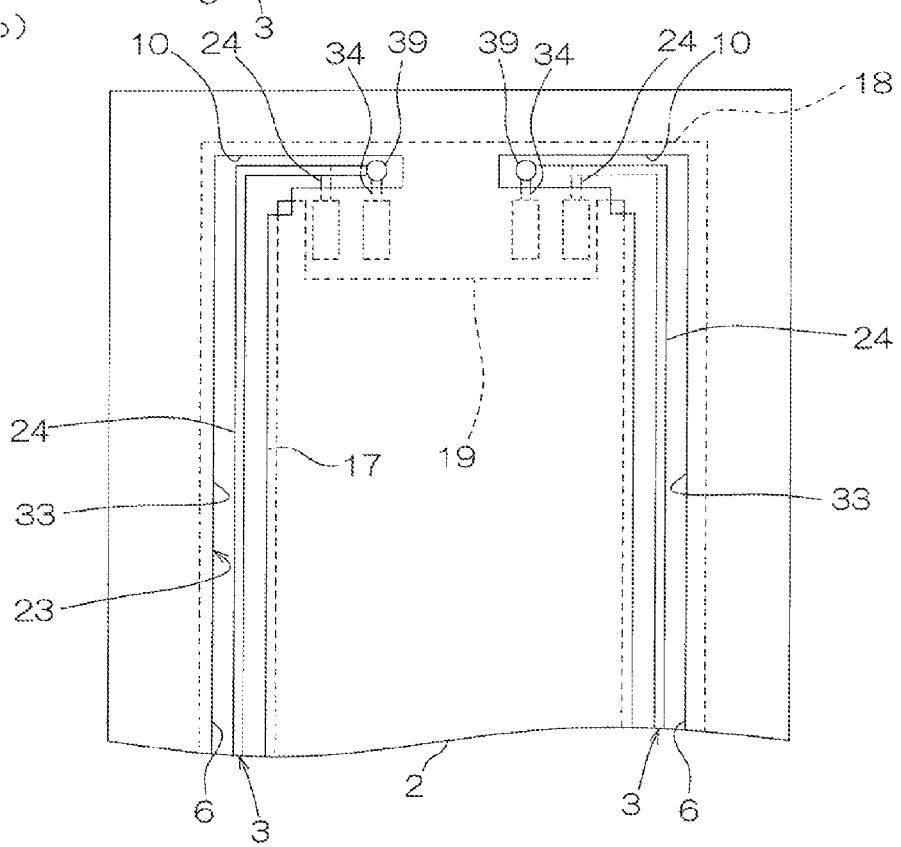
(b)

SUSPENSION BOARD WITH CIRCUIT AND PRODUCING METHOD THEREOF

CROSS-REFERENCE TO RELATED APPLICATION

The present application claims the benefit of U.S. Provisional Application No. 61/457,186 filed on Jan. 24, 2011, and claims priority from Japanese Patent Application No. 2011-004248 filed on Jan. 12, 2011, the contents of which are hereby incorporated by reference into this application.

BACKGROUND OF THE INVENTION

1. Field of the Invention

The present invention relates to a suspension board with circuit and a producing method thereof, to be specific, to a suspension board with circuit that is mounted on a hard disk drive, and a producing method thereof.

2. Description of Related Art

A suspension board with circuit mounted on a hard disk drive is mounted with a slider mounted with a magnetic head and allows the slider to be floated with a minute space with respect to a hard disk.

The slider is required to stably maintain a floating position (a position angle) to be fixed with respect to the hard disk without being influenced by moisture contained in the air, heat, and the like.

To meet the above-described requirement, for example, it has been suggested that in a suspension board including a metal board, an insulating layer that is formed thereon, a wire layer that is formed thereon, and a cover layer that is formed thereon, the coefficient of hygroscopic swelling of an insulating layer forming material and a cover layer forming material is set to be 0% RH to $30 \times 10^{-6}$% RH and a difference therebetween is set to be 0 to $5 \times 10^{-6}$% RH.

SUMMARY OF THE INVENTION

However, in the suspension board suggested in Japanese Unexamined Patent Publication No. H10-27447, there may be a case where the above-described requirement can not be sufficiently met.

It is an object of the present invention to provide a suspension board with circuit that is capable of preventing a deformation of a gimbal portion under a high humidity atmosphere, so that a position angle of a slider with respect to a hard disk can be stably maintained, and a producing method thereof.

A suspension board with circuit of the present invention includes a metal supporting layer, an insulating layer formed on the metal supporting layer, and a conductive layer formed on the insulating layer, wherein a gimbal portion is provided therein and an opening penetrating the metal supporting layer in the up-down direction is formed in the gimbal portion, and the gimbal portion includes a tongue portion formed at the inner side of the opening for being mounted with a slider mounted with a magnetic head for being electrically connected to the conductive layer, an outrigger portion formed at the outer side of the opening to support the tongue portion, and a passing portion passing through the opening of the gimbal portion and/or an outer side region of the outrigger portion, wherein the passing portion includes the conductive layer and the insulating layer covering the conductive layer, and the thickness of a lower half portion of the insulating layer in the passing portion is the same as that of an upper half portion thereof.

In the suspension board with circuit of the present invention, it is preferable that a distance between the center in the up-down direction in the passing portion and the upper surface of the upper half portion of the conductive layer is the same as that between the center in the up-down direction in the passing portion and the lower surface of the lower half portion of the conductive layer.

In the suspension board with circuit of the present invention, it is preferable that the insulating layer in the passing portion includes an intermediate insulating layer; the conductive layer in the passing portion includes a first conductive layer and a second conductive layer that is formed on the first conductive layer via the intermediate insulating layer; and the thickness of the first conductive layer is the same as that of the second conductive layer.

In the suspension board with circuit of the present invention, it is preferable that the upper half portion and the lower half portion of the conductive layer in the passing portion are formed to be symmetric with the center in the up-down direction as the center.

In the suspension board with circuit of the present invention, it is preferable that the insulating layer in the passing portion includes a first insulating cover layer that is formed below the intermediate insulating layer covering a lower portion of the conductive layer and a second insulating cover layer that is formed on the intermediate insulating layer covering an upper portion of the conductive layer; and the lower half portion of the insulating layer consists of the lower half portion of the intermediate insulating layer and the first insulating cover layer, and the upper half portion of the insulating layer consists of the upper half portion of the intermediate insulating layer and the second insulating cover layer.

In the suspension board with circuit of the present invention, it is preferable that the upper half portion and the lower half portion of the insulating layer in the passing portion are formed to be symmetric with the center in the up-down direction as the center.

The method for producing a suspension board with circuit of the present invention, provided with a gimbal portion including a tongue portion on which a slider mounted with a magnetic head is to be mounted and an outrigger portion that supports the tongue portion, includes the steps of preparing a metal supporting layer, forming an insulating layer on the metal supporting layer, forming a conductive layer on the insulating layer, and forming, in the metal supporting layer, an opening that corresponds to the conductive layer in the gimbal portion and defines the tongue portion from the outrigger portion, wherein in the step of forming the insulating layer, the insulating layer is formed so that the insulating layer covers the conductive layer and the thickness of a lower half portion of the insulating layer in a passing portion passing through the opening and/or an outer side region of the outrigger portion is the same as that of an upper half portion of the insulating layer in the passing portion.

In the method for producing the suspension board with circuit of the present invention and the suspension board with circuit obtained by the method, the thickness of the lower half portion of the insulating layer in the passing portion is the same as that of the upper half portion of the insulating layer in the passing portion, so that even when the lower half portion and the upper half portion of the insulating layer in the passing portion absorb moisture and expand under a high humidity atmosphere, they expand at the same rate. Therefore, a deformation of the passing portion due to the absorption of moisture can be effectively prevented.

As a result, the position angle of the slider mounted on the suspension board with circuit with respect to the hard disk can be stably maintained.

BRIEF DESCRIPTION OF THE DRAWINGS

FIG. 7 shows drawings for describing a process of forming the insulating base layer in FIG. 5 (b):
  (a) illustrating a plan view and
  (b) illustrating a bottom view.

FIG. 9 shows drawings for describing a process of forming a first conductive layer and a second conductive layer in FIG. 5 (d):
  (a) illustrating a plan view and
  (b) illustrating a bottom view.

DETAILED DESCRIPTION OF THE INVENTION

Figure 1:
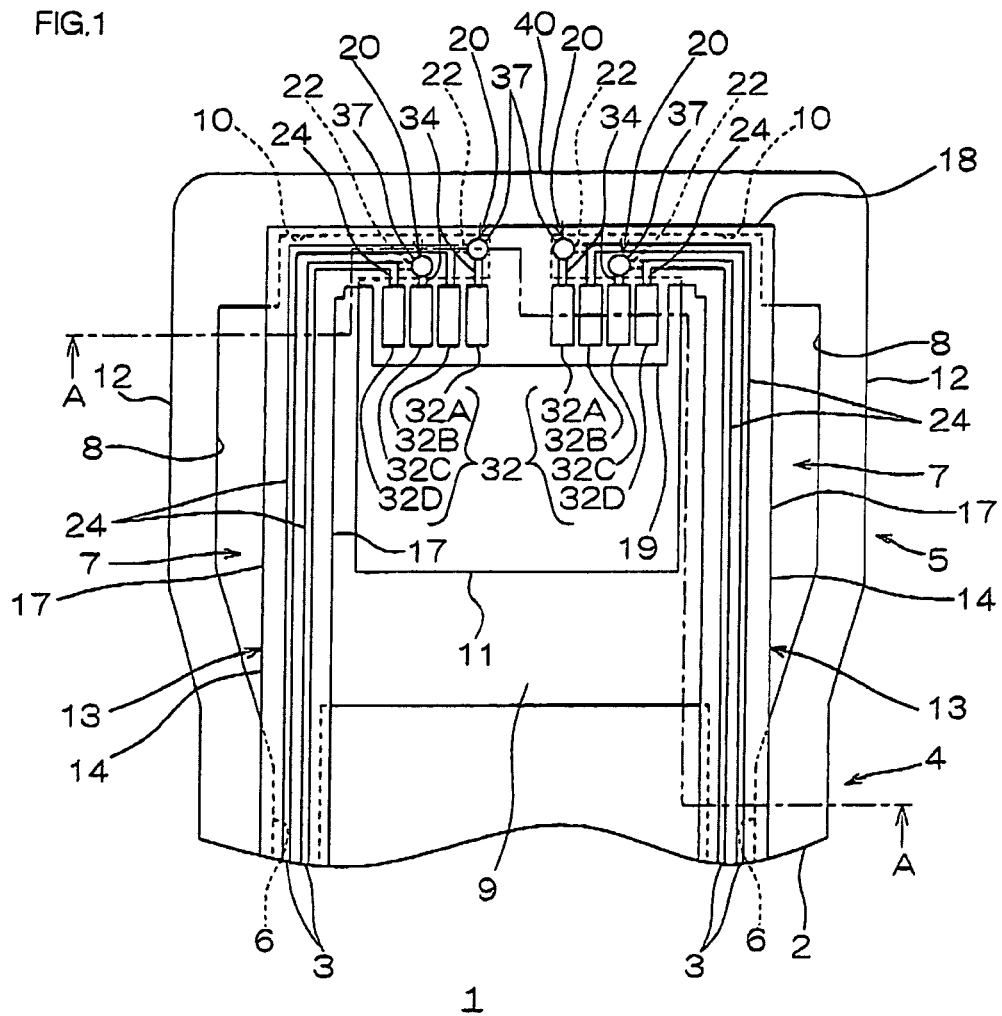
FIG. 1 shows a plan view of a gimbal portion of one embodiment of a suspension board with circuit of the present invention.
Figure 2:
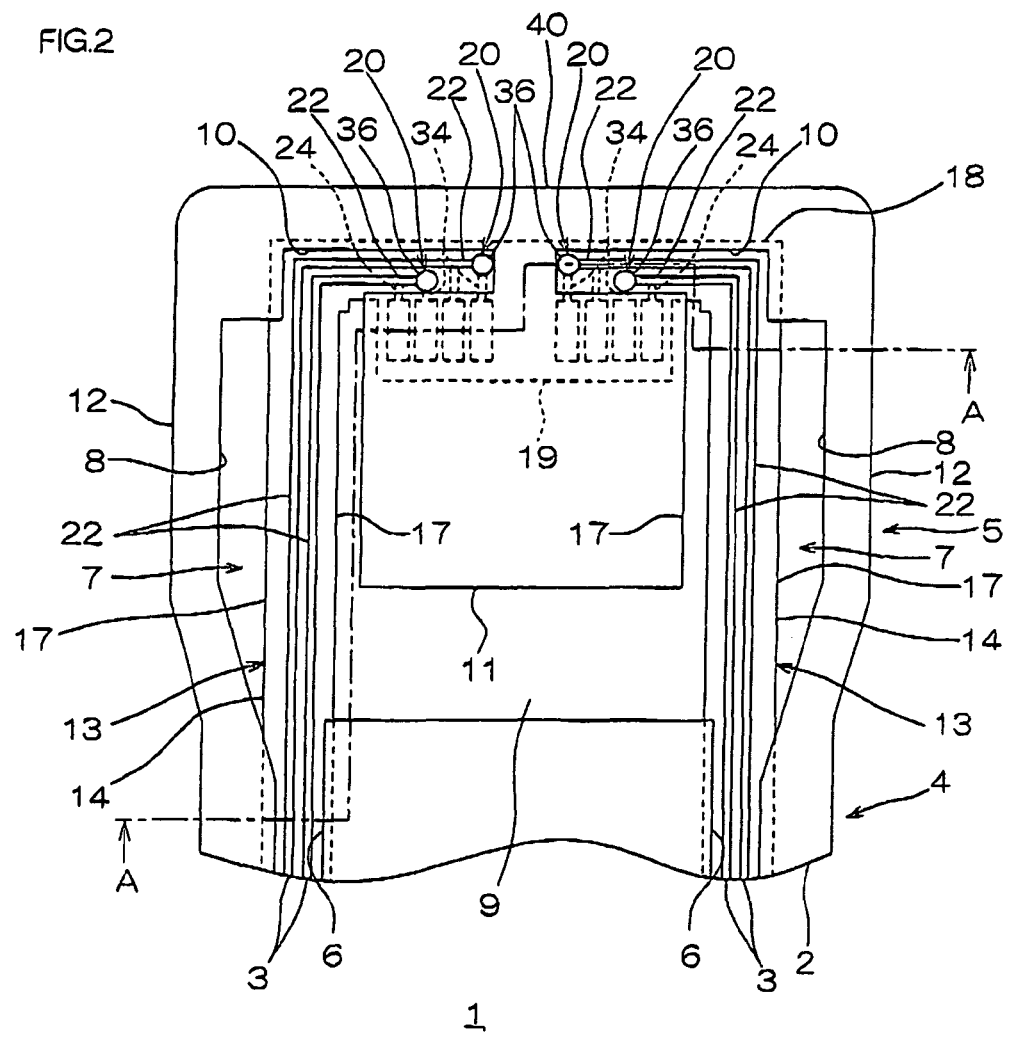
FIG. 2 shows a bottom view of the gimbal portion shown in FIG. 1.
Figure 3:
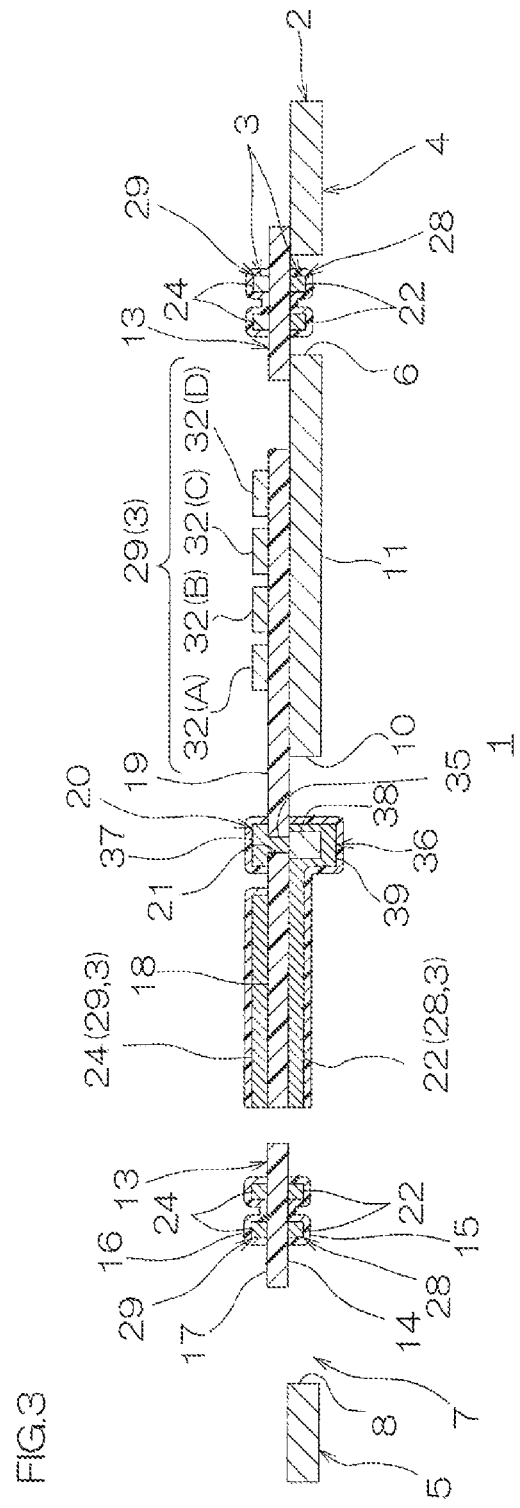
FIG. 3 shows a sectional view, taken along the line A-A in FIGS. 1 and 2.
Figure 4:
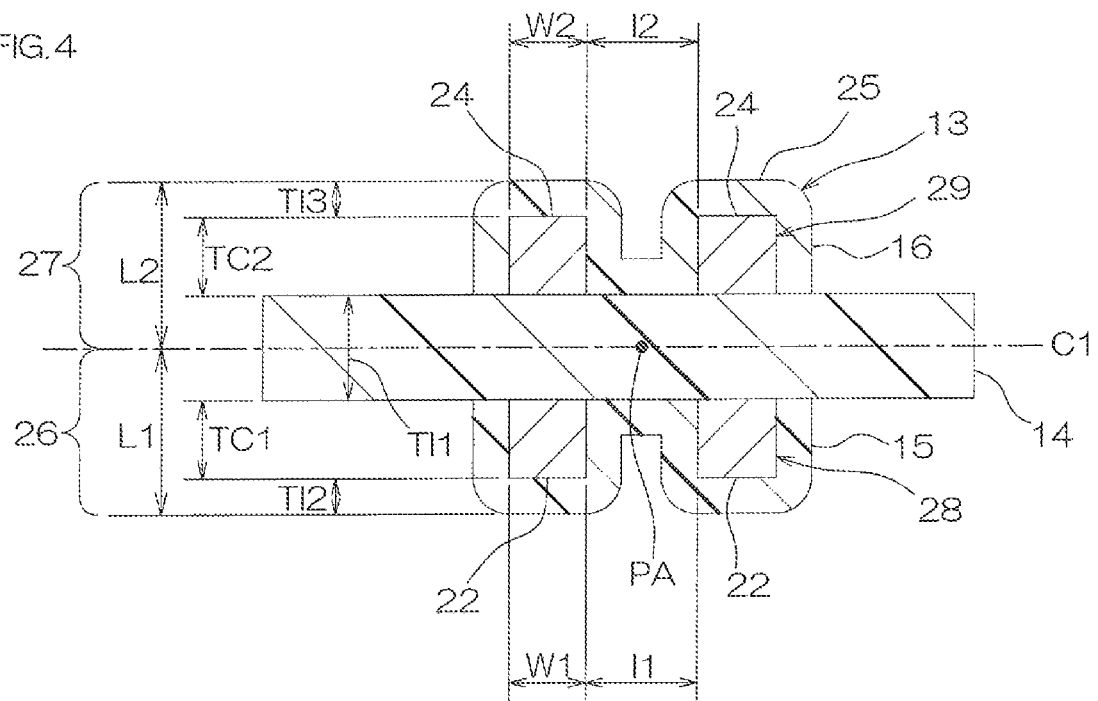
FIG. 4 shows an enlarged sectional view of a passing portion of the gimbal portion shown in FIG. 3.
Figure 5:
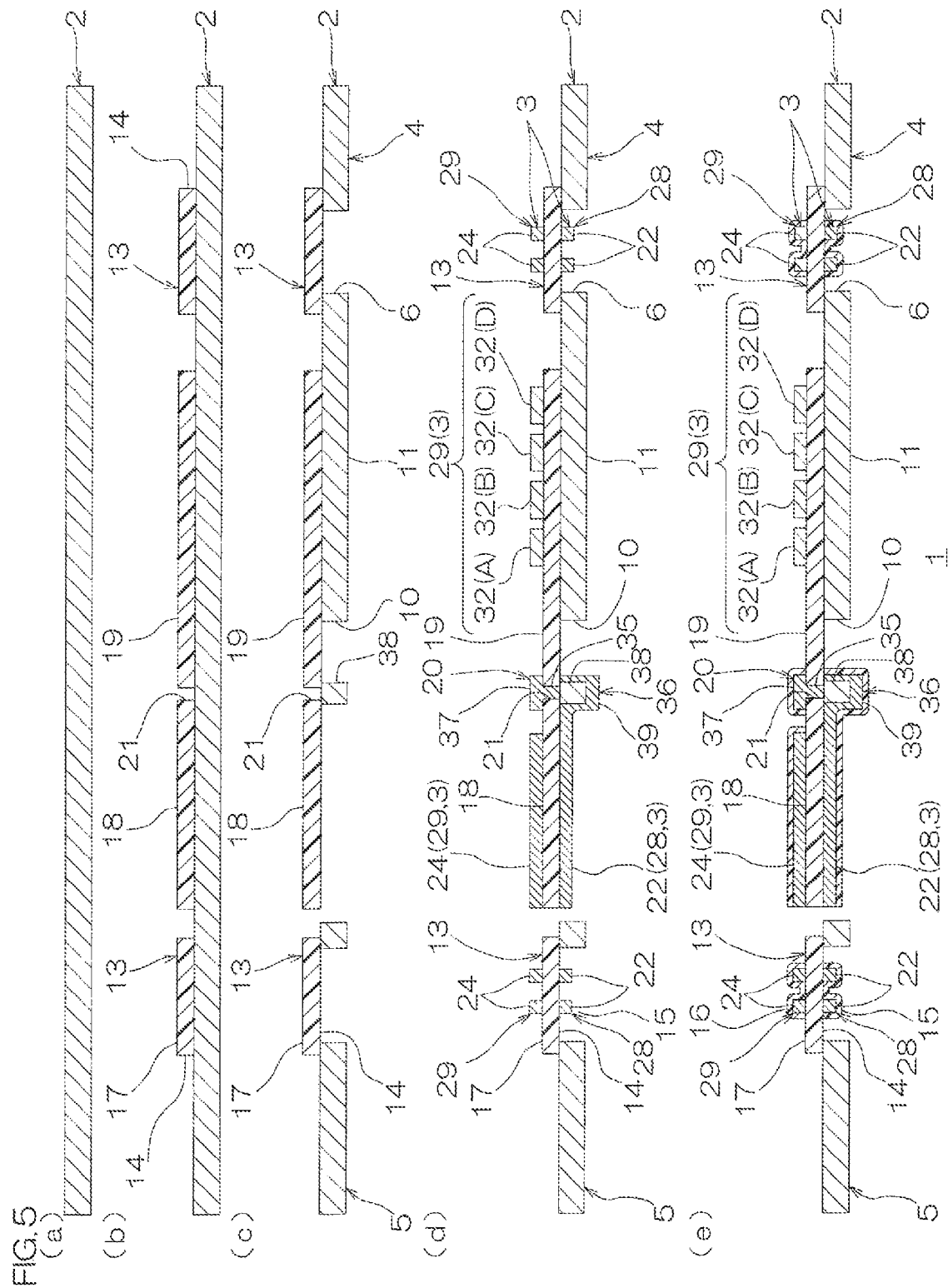
FIG. 5 shows process drawings for describing a method for producing the suspension board with circuit shown in FIG. 1 and process drawings corresponding to the sectional view in FIG. 3:
  (a) illustrating a step of preparing a metal supporting layer,
  (b) illustrating a step of forming an insulating base layer,
  (c) illustrating a step of forming a slit,
  (d) illustrating a step of forming a conductive layer, and
  (e) illustrating a step of forming a first insulating cover layer and a second insulating cover layer.
Figure 6:
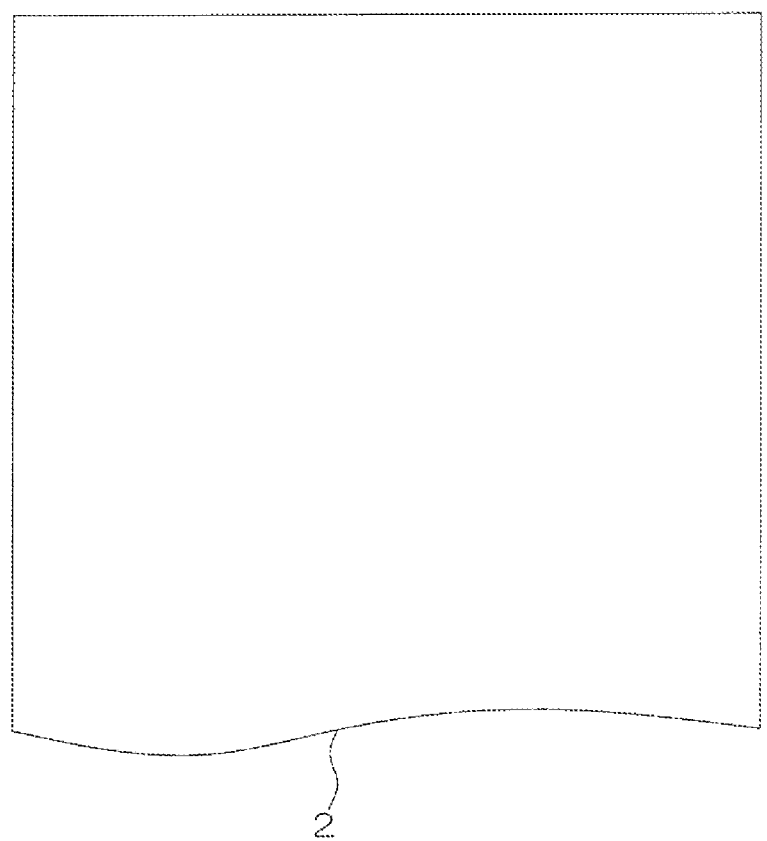
FIG. 6 shows a plan view for describing a process of preparing the metal supporting layer in FIG. 5 (a).
Figure 8:
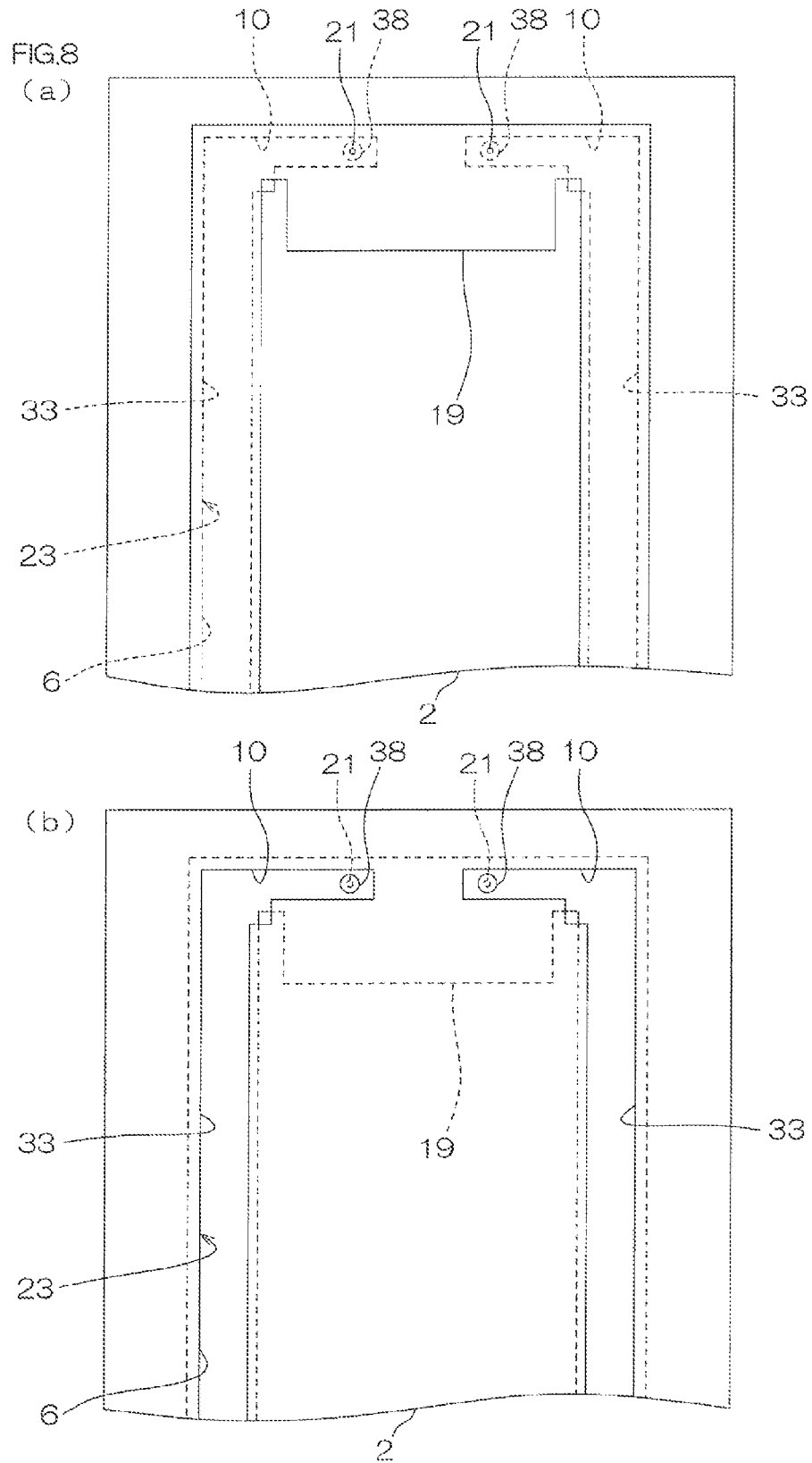
FIG. 8 shows drawings for describing a process of forming the slit in FIG. 5 (c):
  (a) illustrating a plan view and
  (b) illustrating a bottom view.

FIG. 1 shows a plan view of a gimbal portion of one embodiment of a suspension board with circuit of the present invention. FIG. 2 shows a bottom view of the gimbal portion shown in FIG. 1. FIG. 3 shows a sectional view, taken along the line A-A in FIGS. 1 and 2. FIG. 4 shows an enlarged sectional view of a passing portion of the gimbal portion shown in FIG. 3. FIG. 5 shows process drawings for describing a method for producing the suspension board with circuit shown in FIG. 1 and process drawings corresponding to the sectional view in FIG. 3. FIG. 6 shows a plan view for describing a process of preparing the metal supporting layer in FIG. 5 (a). FIG. 7 shows drawings for describing a process of forming the insulating base layer in FIG. 5 (b). FIG. 8 shows drawings for describing a process of forming the slit in FIG. 5 (c). FIG. 9 shows drawings for describing a process of forming a first conductive layer and a second conductive layer in FIG. 5 (d).

In FIGS. 1, 2, and 9, a first insulating cover layer 15 and a second insulating cover layer 16 are omitted so as to clearly show the relative arrangement of an insulating base layer 14, a first conductive layer 28, and a second conductive layer 29.

In FIGS. 1 and 2, a suspension board with circuit 1 is mounted with a slider (not shown) mounted with a magnetic head (not shown) and allows the slider to be floated with a minute space with respect to a hard disk drive.

In the suspension board with circuit 1, a conductive layer 3 is supported by a metal supporting layer 2.

The metal supporting layer 2 is formed into a flat belt shape extending in the lengthwise direction. The metal supporting layer 2 integrally includes a wire portion 4 that is disposed at one side in the lengthwise direction (hereinafter referred to as the rear side, the lower side of the paper surface in FIGS. 1 and 2) and a gimbal portion 5 that is disposed at the other side in the lengthwise direction (hereinafter referred to as the front side, the upper side of the paper surface in FIGS. 1 and 2) of the wire portion 4.

The wire portion 4 is formed into a generally rectangular shape in plane view extending in the front-rear direction.

In the wire portion 4, two pieces of slits 6 extending along the front-rear direction are formed at spaced intervals to each other in the widthwise direction (the direction perpendicular to the front-rear direction). Each of the slits 6 extends in a linear shape along the front-rear direction. Although omitted in FIG. 1, an external-side terminal to be described later is disposed at the rear end portion of the wire portion 4.

The gimbal portion 5 is formed continuously from the front end edge of the wire portion 4 and is formed into a generally rectangular shape in plane view protruding toward the both widthwise outer sides (the direction perpendicular to the front-rear direction, the right-left direction shown in FIGS. 1 and 2) with respect to the wire portion 4.

In the gimbal portion 5, a first opening 7, as an opening, penetrating the metal supporting layer 2 in the thickness direction is formed.

The first opening 7 is formed into a generally C-shape opening toward the front side in plane view. To be specific, the first opening 7 is integrally formed of one pair of wide openings 8 that are spaced in opposed relation to each other in the widthwise direction, extending toward the front-rear direction, a communicating opening 9 that allows the rear end portion of each of the wide openings 8 to be communicated with each other, and bending openings 10 that bend from the front end portion of each of the wide openings 8 toward the widthwise center.

The rear end portion of each of the wide openings 8 is communicated with the front end of each of the slits 6. Each of the wide openings 8 is formed to have a wider width than that of the slit 6.

The gimbal portion 5 includes a tongue portion 11 that is sandwiched between the widthwise inner sides of one pair of the wide openings 8, outrigger portions 12 that are disposed respectively at the widthwise outer sides of one pair of the wide openings 8, and a connecting portion 40 that is disposed at the front sides of the tongue portion 11 and the outrigger portions 12.

The tongue portion 11 is formed into a generally rectangular tongue shape in plane view so as to extend from the connecting portion 40 toward the rear side. A slider (not shown) is to be mounted on the upper surface of the tongue portion 11.

The connecting portion 40 is, at the front sides of the tongue portion 11 and the gimbal portion 5, formed into a generally rectangular shape in plane view extending along the widthwise direction.

The outrigger portions 12 are connected with the tongue portion 11 via the connecting portion 40. In this way, the tongue portion 11 is supported.

As shown in FIG. 3, the suspension board with circuit 1 includes the metal supporting layer 2, an insulating layer 13 that is formed on the metal supporting layer 2, and the conductive layer 3 that is formed on the insulating layer 13.

The metal supporting layer 2 is formed of a metal material such as stainless steel, 42-alloy, aluminum, copper-beryllium, phosphor bronze, nickel, iron, copper, or alloys thereof. Preferably, the metal supporting layer 2 is formed of stainless steel from the viewpoint of spring characteristics and corrosion resistance.

The metal supporting layer 2 has a thickness in the range of, for example, 5 to 50 μm, or preferably 10 to 30 μm.

The insulating layer 13 is formed into a pattern including a region in which the conductive layer 3 is formed. The insulating layer 13 includes the insulating base layer 14 as an intermediate insulating layer, the first insulating cover layer 15 that is formed below the insulating base layer 14, and the second insulating cover layer 16 that is formed on the insulating base layer 14.

As shown in FIGS. 1 and 2, the insulating base layer 14 is, in the wire portion 4, formed so as to extend in a linear shape in the front-rear direction and is formed so as to extend across the metal supporting layer 2 at the both widthwise sides in each of the slits 6.

The insulating base layer 14 is, in the gimbal portion 5, formed into a generally inverted U-shape in plane view in which the widthwise center slightly protrudes toward the rear side. To be specific, the insulating base layer 14 includes one pair of base passing portions 17 that pass through the wide openings 8 in the front-rear direction, a base connecting portion 18 that is formed so as to connect the front end portion of each of the base passing portions 17 to each other and to include each of the bending openings 10 in plane view, and a base protruding portion 19 that protrudes from the widthwise center of the base connecting portion 18 toward the rear side in a generally rectangular shape in plane view and includes the front side portion in the tongue portion 11.

The base passing portion 17 forms a passing portion 25 together with the first insulating cover layer 15, the second insulating cover layer 16, and the conductive layer 3 to be described later.

The base connecting portion 18 is formed so as to extend along the widthwise direction.

As shown in FIG. 3, in the base connecting portion 18, a base opening 21 corresponding to a conducting portion 20 to be described later is formed. The base opening 21 is formed into a generally circular shape in plane view so as to penetrate the base connecting portion 18 in the thickness direction.

The first insulating cover layer 15 is, below the insulating base layer 14, formed so as to cover a first wire 22 to be described next.

The second insulating cover layer 16 is, on the insulating base layer 14, formed so as to cover a second wire 24 to be described next.

The base connecting portion 18, the first insulating cover layer 15, and the second insulating cover layer 16 each are, for example, formed of the same or different insulating materials. Preferably, the base connecting portion 18, the first insulating cover layer 15, and the second insulating cover layer 16 are all formed of the same insulating material. An example of the insulating material includes a heat-resistant insulating material such as polyimide, polybenzimidazole, polyether imide, polyphenylene ether, benzocyclobutene, epoxy resin, phenol resin, and acrylic resin. Preferably, polyimide is used from the viewpoint of heat resistance, mechanical strength, and thermal expansion coefficient.

For example, polyimide can be obtained by reacting an organic tetracarboxylic dianhydride (for example, 3,3',4,4'-biphenyl tetracarboxylic dianhydride and the like) with a diamine (for example, 1,4-diaminobenzene, 2,2'-bis(trifluoromethyl)-4,4'-diaminobiphenyl, and the like). The above-described reaction is performed, for example, in an organic solvent (for example, N-methyl-2-pyrrolidone (NMP) and the like) under the presence of a photosensitizer (for example, 1-ethyl-4-(2-nitrophenyl)-1,4-dihydropyridine-3,5-dicarboxylic acid-dimethyl and the like) and/or an additive (for example, 2-(1,2-cyclohexanedicarboxylmide)ethylacrylate) and the like).

The coefficient of hygroscopic swelling of the insulating material is in the range of, for example, 5 to 100 ppm and the thermal expansion coefficient thereof is in the range of, for example, 10 to 100 ppm.

As shown in FIG. 4, the lower half portion of the insulating base layer 14 and the first insulating cover layer 15 are defined as a lower half portion 26 of the insulating layer 13. The upper half portion of the insulating base layer 14 and the second insulating cover layer 16 are defined as an upper half portion 27 of the insulating layer 13.

A thickness TI1 of the insulating base layer 14 is in the range of, for example, 1 to 35 μm, or preferably 3 to 15 μm.

A thickness TI2 of the first insulating cover layer 15 is, for example, the same as a thickness TI3 of the second insulating cover layer 16 and is, to be specific, in the range of, for example, 1 to 30 μm, or preferably 3 to 15 μm.

The thickness TI2 of the first insulating cover layer 15 is a length between the lower surface of the first wire 22 and that of the first insulating cover layer 15 covering the first wire 22.

The thickness TI3 of the second insulating cover layer 16 is a length between the upper surface of the second wire 24 and that of the second insulating cover layer 16 covering the second wire 24.

Therefore, the thickness of the lower half portion 26 of the insulating layer 13, that is, the total thickness of the thickness of the lower half portion of the insulating base layer 14 (½×TI1) and the thickness TI2 of the first insulating cover layer 15, is the same as the thickness of the upper half portion 27 of the insulating layer 13, that is, the total thickness of the thickness of the upper half portion of the insulating base layer 14 (½×TI1) and the thickness TI3 of the second insulating cover layer 16.

To be specific, a thickness TI4 of the lower half portion 26 of the insulating layer 13 and a thickness TI5 of the upper half portion 27 of the insulating layer 13 are in the range of, for example, 5 to 40 μm, or preferably 10 to 30 μm.

The conductive layer 3 is covered by the insulating layer 13. To be specific, the conductive layer 3 includes the first conductive layer 28 that is formed below the insulating base layer 14 and the second conductive layer 29 that is formed on the insulating base layer 14.

The second conductive layer 29 is formed on the upper surface of the insulating base layer 14 and integrally includes a head-side terminal 32 (FIG. 1) that is to be connected to the magnetic head, an external-side terminal (not shown) that is to be connected to an external board (not shown), and the second wire 24 that electrically connects the head-side terminal 32 to the external-side terminal.

A plurality (eight pieces) of the head-side terminals 32 are, at the front side portion of the tongue portion 11, disposed in parallel at spaced intervals to each other in the widthwise direction. The head-side terminal 32 is formed so as to expose from the second insulating cover layer 16. A metal plating layer (not shown) that is made of gold and/or nickel and the like is formed on the surface of the head-side terminal 32.

A plurality (eight pieces) of the external-side terminals (not shown) are, at the rear end portion of the wire portion 4, disposed at spaced intervals to each other. The external-side terminal is formed so as to expose from the second insulating cover layer 16. The metal plating layer (not shown) that is made of gold and/or nickel and the like is formed on the surface of the external-side terminal.

A plurality (four pieces) of the second wires 24 are, over the front-rear direction of the suspension board with circuit 1, provided at spaced intervals to each other in the widthwise direction. Each of two pieces of the second wires 24 is provided with respect to each of the slits 6, each of the wide openings 8, and each of the bending openings 10.

To be specific, the second wire 24 extends along the slit 6 in the front-rear direction so as to be included in the slit 6 when projected in the thickness direction. The second wire 24 is, in the gimbal portion 5, formed into a generally L-shape in plane view extending along the base passing portion 17 and the base connecting portion 18 on the upper surfaces thereof.

The side surfaces and the upper surface of the second wire 24 are covered by the second insulating cover layer 16.

The first conductive layer 28 is formed so as to sandwich the insulating base layer 14 with the second conductive layer 29 in the thickness direction. That is, the first conductive layer 28 is formed on the lower surface of the insulating base layer 14 and includes the first wire 22.

The first wire 22 is, when projected in the thickness direction, formed into a pattern of being overlapped with the above-described second wire 24. To be specific, each of the first wires 22 is disposed in opposed relation to each of the second wires 24 in the thickness direction.

The lower surface and the side surfaces of the first wire 22 are covered by the first insulating cover layer 15.

As shown in FIGS. 1 and 3, the conductive layer 3 further includes the conducting portion 20 and a terminal connecting portion 34 that electrically connects the conducting portion 20 to the head-side terminal 32.

The conducting portion 20 includes a filled portion 35 that is filled in the base opening 21 of the base connecting portion 18, a first conducting portion 36 that is formed below the filled portion 35, and a second conducting portion 37 that is formed on the filled portion 35.

The first conducting portion 36 includes a support conducting portion 38 and a first conductive portion 39 that is formed around the support conducting portion 38.

The support conducting portion 38 is formed into a generally circular shape in plane view protruding from the lower surface of the filled portion 35 toward the lower side and the outer side. The support conducting portion 38 is formed of the same metal material as that of the metal supporting layer 2.

The first conductive portion 39 covers the lower surface and the side surfaces of the support conducting portion 38. The widthwise outer side portion of the first conductive portion 39 is connected to the first wire 22.

The second conducting portion 37 is formed into a generally circular shape in plane view protruding from the upper surface of the filled portion 35 toward the upper side and the outer side.

As shown in FIGS. 1 and 2, the terminal connecting portion 34 extends from the rear end portion of the second conducting portion 37 toward the rear side to reach the head-side terminal 32.

The conducting portion 20 and the terminal connecting portion 34 electrically connect the first wire 22 to the head-side terminal 32.

The head-side terminals 32 include one set consisting of a first head-side terminal 32A, a second head-side terminal 32B, a third head-side terminal 32C, and a fourth head-side terminal 32D respectively, which are sequentially disposed from the widthwise center side toward the widthwise outer side (the both sides of one side and the other side). They are all formed on the same planar surface, that is, on the upper surface of the insulating base layer 14. Each of the first head-side terminals 32A and each of the third head-side terminals 32C are electrically connected to the first wire 22 via the terminal connecting portion 34 and the conducting portion 20. Each of the second head-side terminals 32B and each of the fourth head-side terminals 32D are electrically connected to the second wire 24.

The first conductive layer 28 and the second conductive layer 29 are formed of, for example, the same material and to be specific, are formed of a conductive material such as copper, nickel, gold, solder, or alloys thereof. Preferably, the first conductive layer 28 and the second conductive layer 29 are formed of copper from the viewpoint of conductivity.

A thickness TC1 of the first conductive layer 28 is, for example, the same as a thickness TC2 of the second conductive layer 29 and is, to be specific, in the range of, for example, 3 to 30 μm, or preferably 5 to 20 μm.

A width W1 of the first wire 22 is, for example, the same as a width W2 of the second wire 24 and is, to be specific, in the range of, for example, 5 to 200 μm, or preferably 8 to 100 μm. A space I1 between the first wires 22 in the slit 6 is, for example, the same as a space I2 between the second wires 24 in the slit 6 and is, to be specific, in the range of, for example, 5 to 200 μm, or preferably 8 to 100 μm.

The width of each of the head-side terminals 32 and that of each of the external-side terminals are in the range of, for example, 2 to 1000 μm, or preferably 30 to 800 μm. The space between the head-side terminals 32 and that between the external-side terminals are in the range of, for example, 2 to 1000 μm, or preferably 30 to 800 μm.

The insulating layer 13 passing through the wide opening 8 consists of the insulating base layer 14 (the base passing portion 17), the first insulating cover layer 15, and the second insulating cover layer 16. The conductive layer 3 passing through the wide opening 8 consists of the first wire 22 and the second wire 24.

A distance L1 between a center C1 in the up-down direction of the insulating layer 13 passing through the wide opening 8 and the lower surface of the first insulating cover layer 15 is the same as a distance L2 between the center C1 in the up-down direction of the insulating layer 13 passing through the wide opening 8 and the upper surface of the second insulating cover layer 16, and is, to be specific, in the range of, for example, 5 to 40 μm, or preferably 10 to 30 μm.

In addition, a distance L3 between the center C1 in the up-down direction of the insulating layer 13 passing through the wide opening 8 and the lower surface of the first conductive layer 28 is the same as a distance L4 between the center C1 in the up-down direction of the insulating layer 13 passing through the wide opening 8 and the upper surface of the second conductive layer 29, and is, to be specific, in the range of, for example, 4 to 35 μm, or preferably 8 to 25 μm.

The first wire 22 passing through the wide opening 8 and the second wire 24 passing through the wide opening 8 are formed to be symmetric (surface symmetric) with the surface passing through the center in the up-down direction (the C1 in dashed-dotted line) as the center.

Furthermore, the first wire 22 passing through the wide opening 8 and the second wire 24 passing through the wide opening 8 are formed to be point symmetric with a passing axis PA that proceeds the widthwise center and the thickness center of the base passing portion 17 along the front-rear direction as the center.

The lower half portion of the base passing portion 17 and the first insulating cover layer 15 passing through the wide opening 8 are formed to be symmetric (surface symmetric) with respect to the upper half portion of the base passing portion 17 and the second insulating cover layer 16 passing through the wide opening 8 with the surface passing through the center in the up-down direction (the C1 in dashed-dotted line) as the center.

Next, a method for producing the suspension board with circuit 1 is described with reference to FIGS. 1 to 3 and FIGS. 5 to 9. In FIGS. 7, 8, and 9, the third head-side terminal 32C and the fourth head-side terminal 32D are omitted for easy understanding of the drawings.

In this method, as shown in FIGS. 5 (a) and 6, the metal supporting layer 2 in a sheet state is first prepared.

Next, in this method, as shown in FIGS. 5 (b), 7 (a), and 7 (b), the insulating base layer 14 is formed on the metal supporting layer 2.

To form the insulating base layer 14 on the metal supporting layer 2, for example, a varnish of a photosensitive polyimide resin precursor (a solution of a photosensitive polyamide acid resin) is first applied onto the entire upper surface of the metal supporting layer 2 and is then dried to form a base film. Thereafter, the base film is exposed to light with the above-described pattern and is then developed. Subsequently, the base film is heated to be cured.

Next, in this method, as shown in FIGS. 5 (c), 8 (a), and 8 (b), a second opening 23 and the slit 6 are integrally formed in the metal supporting layer 2.

The second opening 23, penetrating the metal supporting layer 2 in the thickness direction, is an auxiliary opening in order to open the first opening 7 and is integrally formed of a narrow opening 33 and the bending opening 10.

The narrow opening 33 is formed to be narrower than the wide opening 8 (FIGS. 1 and 2) that is formed next so that the metal supporting layer 2 supports the both widthwise end portions of the base passing portion 17. The narrow opening 33 is formed into a generally rectangular shape in plane view having the same length (the length in the lengthwise direction) as that of the wide opening 8. The rear end portion of the narrow opening 33 is continuous (communicated) to the front end of the slit 6.

Each of the narrow openings 33 is, in plane view, formed into the same linear shape as each of the slits 6.

The bending opening 10 is formed so that the support conducting portion 38 remains in the metal supporting layer 2.

Next, in this method, as shown in FIGS. 5 (d), 9 (a), and 9 (b), the first conductive layer 28 is formed below the insulating base layer 14 and the second conductive layer 29 is formed on the insulating base layer 14.

The first conductive layer 28 and the second conductive layer 29 are formed, for example, by a known conductive pattern forming method such as an additive method.

Together with the above-described formation of the first conductive layer 28 and the second conductive layer 29, the first conductive portion 39, the second conducting portion 37, and the terminal connecting portion 34 are formed. The first conductive portion 39 is formed so as to protrude toward the lower side and the outer sides (the both sides in the front-rear direction and the both sides in the widthwise direction) of the support conducting portion 38.

In this way, the conducting portion 20 is formed.

Next, in this method, as shown in FIG. 5 (e), the first insulating cover layer 15 is formed below the insulating base layer 14 so as to cover the first wire 22 and the second insulating cover layer 16 is formed on the insulating base layer 14 so as to cover the second wire 24.

To form the first insulating cover layer 15 and the second insulating cover layer 16, for example, a varnish of a photosensitive polyimide resin precursor (a solution of a photosensitive polyamide acid resin) is applied onto the entire both surfaces of the insulating base layer 14 and is then dried to form a cover film. Thereafter, the cover film is exposed to light with the above-described pattern and is then developed. Subsequently, the cover film is heated to be cured.

In addition, the first insulating cover layer 15 and the second insulating cover layer 16 can also be formed, for example, by preliminarily forming a synthetic resin into a film having the above-described pattern and adhesively bonding the film to the both surfaces of the insulating base layer 14 via a known adhesive layer (not shown).

Furthermore, the first insulating cover layer 15 and the second insulating cover layer 16 can be formed at the same time or sequentially. Preferably, the first insulating cover layer 15 and the second insulating cover layer 16 are formed at the same time.

Next, in this method, as shown in FIGS. 1 to 3, the first opening 7 is formed in the metal supporting layer 2.

The first opening 7 is formed by expanding the width of the narrow opening 33 of the second opening 23.

Together with the formation of the first opening 7, the metal supporting layer 2 is cut out into the above-described outer shape.

In this way, the outrigger portion 12 and the tongue portion 11 are formed, and the passing portion 25 is formed independently from the surrounding outrigger portion 12 and tongue portion 11. That is, the passing portion 25 is spaced apart from the outrigger portion 12 and the tongue portion 11 in the widthwise direction.

Thereafter, though not shown, a plating layer is formed on the surfaces of the head-side terminal 32 and the external-side terminal by a plating and the like.

The suspension board with circuit 1 is obtained in this manner.

Thereafter, the slider (not shown) mounted with the magnetic head is mounted on the tongue portion 11 of the suspension board with circuit 1 and the magnetic head (not shown) is connected to the head-side terminal 32. The external board (not shown) is connected to the external-side terminal (not shown).

In the suspension board with circuit 1, the thickness TI4 of the lower half portion 26 of the insulating layer 13 in the passing portion 25 is the same as the thickness TI5 of the upper half portion 27 of the insulating layer 13 in the passing portion 25. Therefore, even when the lower half portion 26 and the upper half portion 27 of the insulating layer 13 in the passing portion 25 absorb moisture and expand under a high humidity atmosphere, they expand at the same rate. Therefore, a deformation, such as a warp, of the passing portion 25 due to the absorption of moisture can be effectively prevented.

As a result, the position angle of the slider mounted on the suspension board with circuit 1 with respect to the hard disk can be stably maintained.

The thickness TC1 of the first conductive layer 28 is, for example, the same as the thickness TC2 of the second conductive layer 29. That is, the thickness TC1 of the first wire 22 passing through the wide opening 8 is the same as the thickness TC2 of the second wire 24 passing through the wide opening 8, so that even when the first wire 22 and the second wire 24 passing through the wide opening 8 expand due to heat under a high humidity atmosphere, they expand at the same rate. Therefore, the deformation of the passing portion 25 due to the absorption of moisture can be effectively prevented.

In the embodiments in FIGS. 1 to 3, the base passing portion 17 is formed so as to pass through the first opening 7. Alternatively, for example, though not shown, the base passing portion 17 can be formed so as to pass through the outer side regions of the outrigger portions 12.

Figure 10:
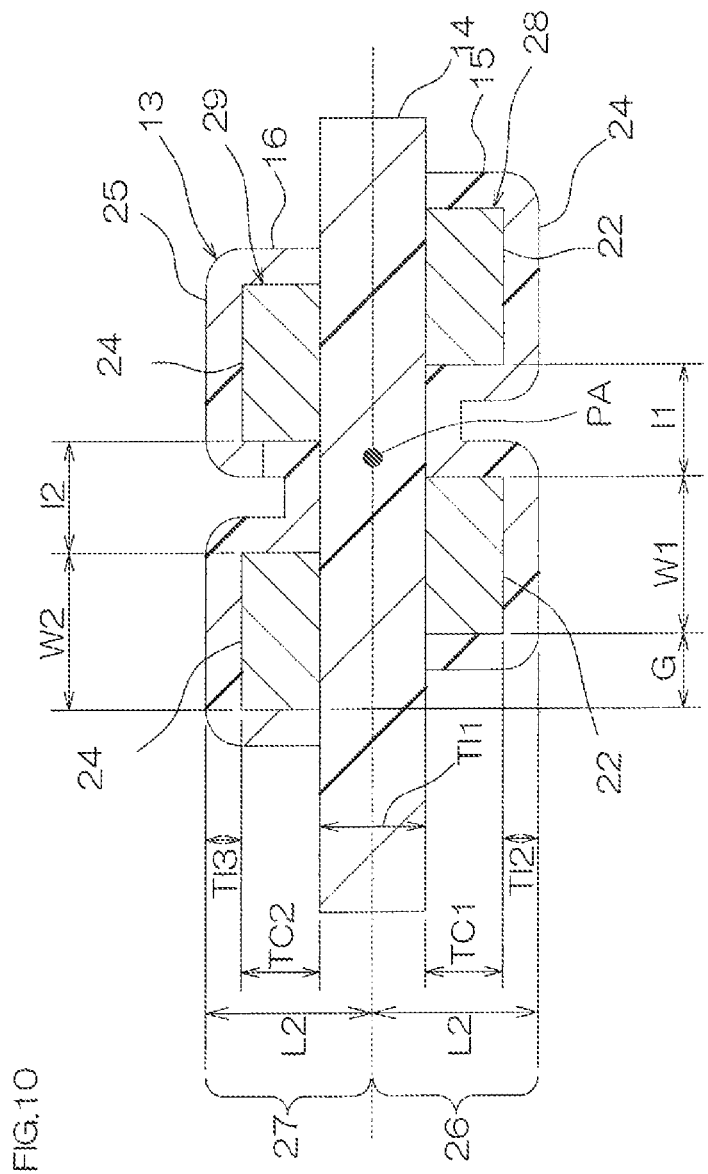
FIG. 10 shows an enlarged sectional view of the passing portion (an embodiment in which a first wire and a second wire are disposed out of alignment when projected in the thickness direction) of another embodiment of the suspension board with circuit of the present invention.
Figure 11:
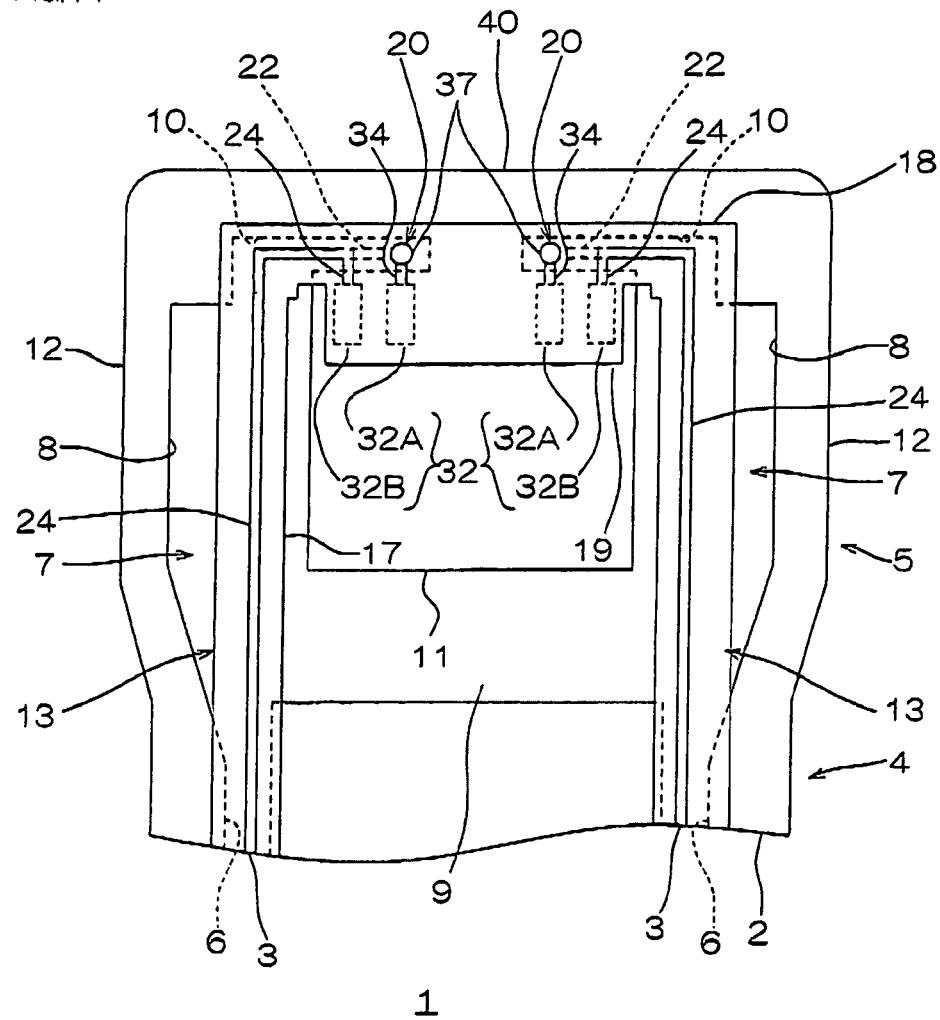
FIG. 11 shows a plan view of the gimbal portion (an embodiment in which four pieces of head-side terminals are provided) of another embodiment of the suspension board with circuit of the present invention.
Figure 12:
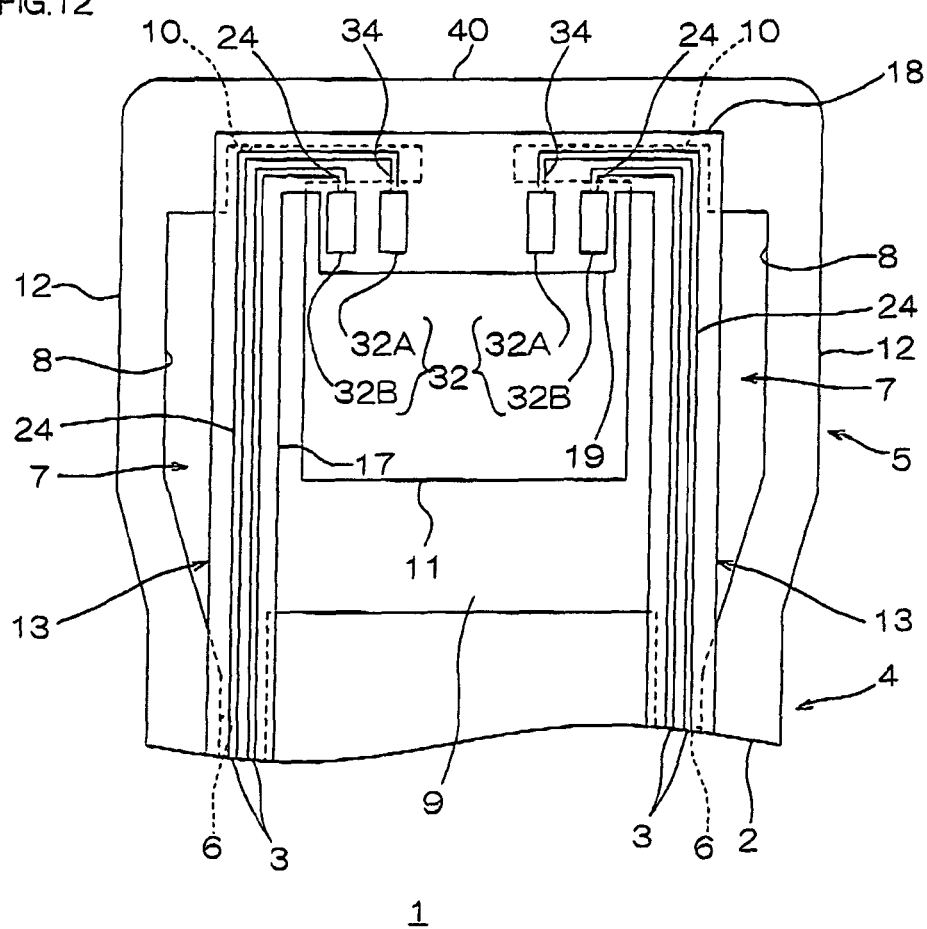
FIG. 12 shows a plan view of the gimbal portion (an embodiment consisting of the insulating base layer, the second wire, and the second insulating cover layer) of another embodiment of the suspension board with circuit of the present invention.
Figure 13:
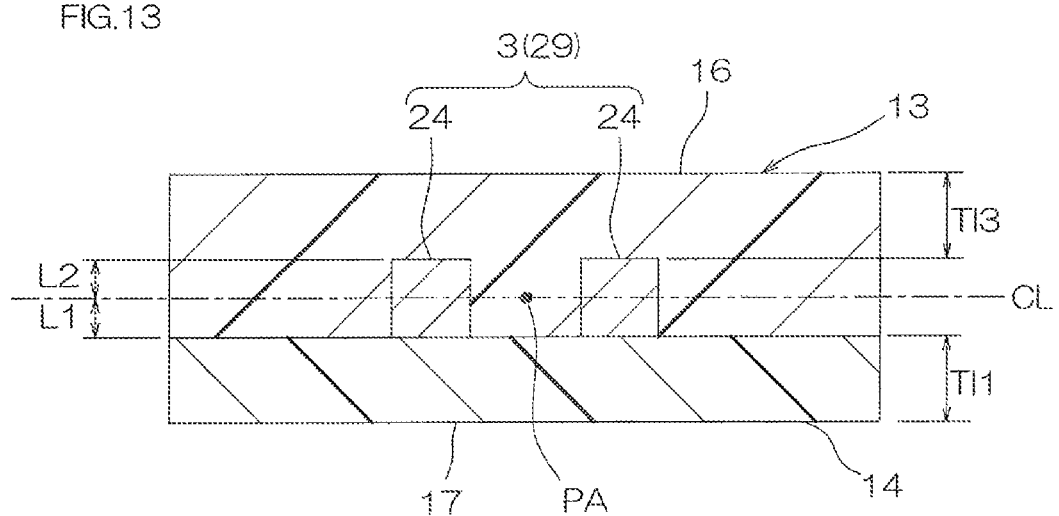
FIG. 13 shows an enlarged sectional view of the passing portion of the gimbal portion shown in FIG. 12.

FIG. 10 shows an enlarged sectional view of the passing portion (an embodiment in which a first wire and a second wire are disposed out of alignment when projected in the thickness direction) of another embodiment of the suspension board with circuit of the present invention. FIG. 11 shows a plan view of the gimbal portion (an embodiment in which four pieces of head-side terminals are provided) of another embodiment of the suspension board with circuit of the present invention. FIG. 12 shows a plan view of the gimbal portion (an embodiment consisting of the insulating base layer, the second wire, and the second insulating cover layer) of another embodiment of the suspension board with circuit of the present invention. FIG. 13 shows an enlarged sectional view of the passing portion of the gimbal portion shown in FIG. 12.

In each figure to be described below, the same reference numerals are provided for members corresponding to each of those described above, and their detailed description is omitted.

In the embodiment in FIG. 4, the first wire 22 is disposed in opposed relation to the second wire 24 in the up-down direction. Alternatively, for example, as shown in FIG. 10, the first wire 22 can be disposed out of alignment with the second wire 24 in the widthwise direction when projected in the thickness direction.

To be specific, in FIG. 10, the first wire 22 and the second wire 24 are formed to be point symmetric with the passing axis PA of the base passing portion 17 as the center.

The widthwise outer side end portion of the first wire 22 passing through the wide opening 8 is, when projected in the thickness direction, overlapped with the widthwise inner side end portion of the second wire 24 passing through the wide opening 8.

A space (gap width) G between the outer side end edge of the first wire 22 and that of the second wire 24 in the widthwise direction is in the range of, for example, 1 to 100 µm, or preferably 1 to 50 µm.

With the embodiment shown in FIG. 10, the same effect as the description above can be obtained.

In the above-described embodiment in FIG. 1, eight pieces of the head-side terminals 32 are provided. However, the number thereof is not particularly limited. As shown in FIG. 11, for example, four pieces of the head-side terminals 32 can be provided.

In FIG. 11, one piece of the second wire 24 is provided with respect to each of the wide openings 8.

With the embodiment shown in FIG. 11, the same effect as the description above can be obtained.

In addition, in the embodiment in FIG. 3, the conductive layer 3 is formed of the first conductive layer 28 and the second conductive layer 29, and the insulating layer 13 is formed of the insulating base layer 14, the first insulating cover layer 15, and the second insulating cover layer 16. Alternatively, for example, as shown in FIGS. 12 and 13, the conductive layer 3 can be formed of the second conductive layer 29, and the insulating layer 13 can be formed of the insulating base layer 14 and the second insulating cover layer 16.

That is, in FIGS. 12 and 13, the conductive layer 3 passing through each of the wide openings 8 is, on the upper surface of the base passing portion 17, provided with one pair of the second wires 24 that are disposed at spaced intervals to each other in the widthwise direction.

The insulating layer 13 passing through the passing portion 25 includes the base passing portion 17 and the second insulating cover layer 16 that is formed on the base passing portion 17 so as to cover the second wire 24.

The thickness TI1 of the base passing portion 17 is the same as the thickness TI3 (the thickness of the second insulating cover layer 16 on the second wire 24) of the second insulating cover layer 16.

The distance L1 between the center C1 in the up-down direction in the passing portion 25 and the lower surface of the second wire 24 is the same as the distance L2 between the center C1 in the up-down direction in the passing portion 25 and the upper surface of the second wire 24.

One pair of the second wires 24 are formed to be symmetric with the surface passing through the center in the up-down direction (the C1 in dashed-dotted line) of the insulating layer 13 as the center and are formed to be point symmetric with the passing axis PA of the base passing portion 17 as the center.

With the embodiments shown in FIGS. 12 and 13, the same effect as the description above can be obtained.

EXAMPLE

While the present invention will be described hereinafter in further detail with reference to Examples and Comparative Example, the present invention is not limited to these Examples and Comparative Example.

Example 1

A metal supporting layer made of stainless steel in a sheet state having a thickness of 18 µm was prepared (ref: FIGS. 5 (a) and 6).

Next, an insulating base layer made of polyimide having a thickness (TI1) of 10 µm was formed on the metal supporting layer (ref: FIGS. 5 (b), 7 (a), and 7 (b)).

To be specific, a solution of a photosensitive polyamide acid resin was first prepared according to a mixing formulation in Table 1. Next, the prepared solution of the photosensitive polyamide acid resin was applied onto the entire upper surface of the metal supporting layer and was then dried to form a base film. Thereafter, the base film was exposed to light with the above-described pattern and was then developed. Subsequently, the base film was heated to be cured. The coefficient of hygroscopic swelling of the insulating base layer was 13 ppm and the thermal expansion coefficient thereof was 18 ppm.

TABLE 1

| Components | Blended Weight (Parts by Weight) |
|---|---|
| 3,3',4,4'-biphenyl tetracarboxylic dianhydride | 8.89 |
| 1,4-diaminobenzene | 2.61 |
| 2,2'-bis(trifluoromethyl)-4,4'-diaminobiphenyl | 1.93 |
| NMP | 82.53 |
| 1-ethyl-4-(2-nitrophenyl)-1,4-dihydropyridine-3,5-dicarboxylic acid-dimethyl (photosensitizer) | 1.34 |
| 2-(1,2-cyclohexanedicarboxyimide)ethylacrylate (additive) | 2.69 |

Next, a second opening and slits were integrally formed in the metal supporting layer by an etching (ref: FIGS. 5 (*c*), 8 (*a*), and 8 (*b*)).

Next, a first conductive layer having a thickness (TC2) of 10 μm was formed below the insulating base layer by an additive method and at the same time, a second conductive layer having a thickness (TC3) of 10 μm was formed on the insulating base layer by the additive method (ref: FIGS. 5 (*d*), 9 (*a*), and 9 (*b*)). The first wire and the second wire were disposed in opposed relation to each other in the thickness direction.

Next, a first insulating cover layer was formed below the insulating base layer so as to cover the first wire and a second insulating cover layer was formed on the insulating base layer so as to cover the second wire (ref: FIG. 5 (*e*)).

To be specific, the solution of the photosensitive polyamide acid resin that was prepared according to the mixing formulation in Table 1 was applied onto the entire both surfaces of the insulating base layer and was then dried to form a cover film. Thereafter, the cover film was exposed to light with the above-described pattern and was then developed. Subsequently, the cover film was heated to be cured.

The coefficient of hygroscopic swelling of the first insulating cover layer and the second insulating cover layer was 13 ppm, and the thermal expansion coefficient thereof was 18 ppm.

A thickness (TI2) of the first insulating cover layer was the same as a thickness (TI3) of the second insulating cover layer and the thickness thereof was 5 μm.

A distance (L1) between a center (C1) in the up-down direction of an insulating layer passing through a wide opening and the lower surface of a first cover passing portion was the same as a distance (L2) between the center (C1) in the up-down direction of the insulating layer passing through the wide opening and the upper surface of a second cover passing portion, and the distance thereof was 20 μm.

A distance (L3) between the center (C1) in the up-down direction of the insulating layer passing though the wide opening and the lower surface of the first conductive layer was the same as a distance (L4) between the center (C1) in the up-down direction of the insulating layer passing through the wide opening and the upper surface of the second conductive layer, and the distance thereof was 15 μm.

Next, a first opening was formed in the metal supporting layer by the etching (ref: FIGS. 1 to 3). To be specific, the first opening was formed by expanding the width of a narrow opening.

Thereafter, a metal plating layer made of gold and nickel was formed on the surfaces of a head-side terminal and an external-side terminal by a plating.

A suspension board with circuit was prepared in this manner.

The dimensions of the metal supporting layer and the insulating base layer in the prepared suspension board with circuit were shown in FIG. 13.

Example 2

A suspension board with circuit was prepared by being processed in the same manner as in Example 1 except that in the formation of a conductive layer, the first wire and the second wire were, when projected in the thickness direction, formed so as to be out of alignment to each other in the widthwise direction and to be point symmetric with a passing axis (PA) as the center (ref: FIG. 10).

A gap width (G) between the first wire and the second wire was 10 μm.

Example 3

A suspension board with circuit was prepared by being processed in the same manner as in Example 1 except that the conductive layer was formed of the second conductive layer and the insulating layer was formed of the insulating base layer and the second insulating cover layer (ref: FIGS. 12 and 13).

The thickness (TI2) of the second insulating cover layer on the second wire was 5 μm, which was the same as the thickness (TI1) of the insulating base layer.

Comparative Example 1

Figure 15:
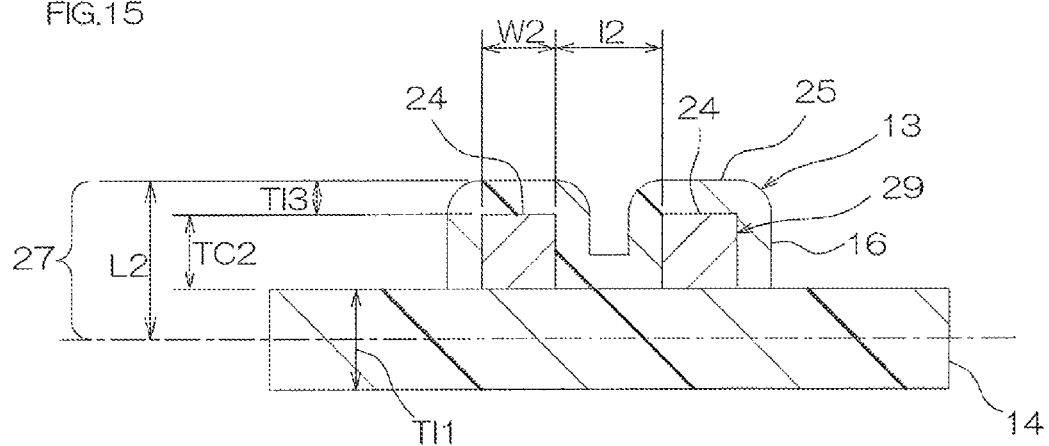
FIG. 15 shows an enlarged sectional view of the passing portion of the suspension board with circuit in Comparative Example 1.

A suspension board with circuit was prepared by being processed in the same manner as in Example 3 except that the thickness (TI2) of the second insulating cover layer on the second wire was 5 μm (ref: FIG. 15).

The thickness (TH) of the insulating base layer was different from the thickness (TI2: 5 μm) of the first insulating cover layer and the thickness thereof was 10 μm.

(Evaluation)

In the suspension board with circuit in Examples 1 to 3 and Comparative Example 1, in a state where a wire portion was fixed to a glass stage, the suspension board with circuit was put in a high humidity vessel with 25° C. and 10% RH, and that with 25° C. and 80% RH, for two hours, respectively.

Thereafter, in the high humidity vessel, the amount of displacement at the center of a tongue portion in the thickness direction was measured with laser light to evaluate the suspension board with circuit in accordance with the following references.

Figure 14:
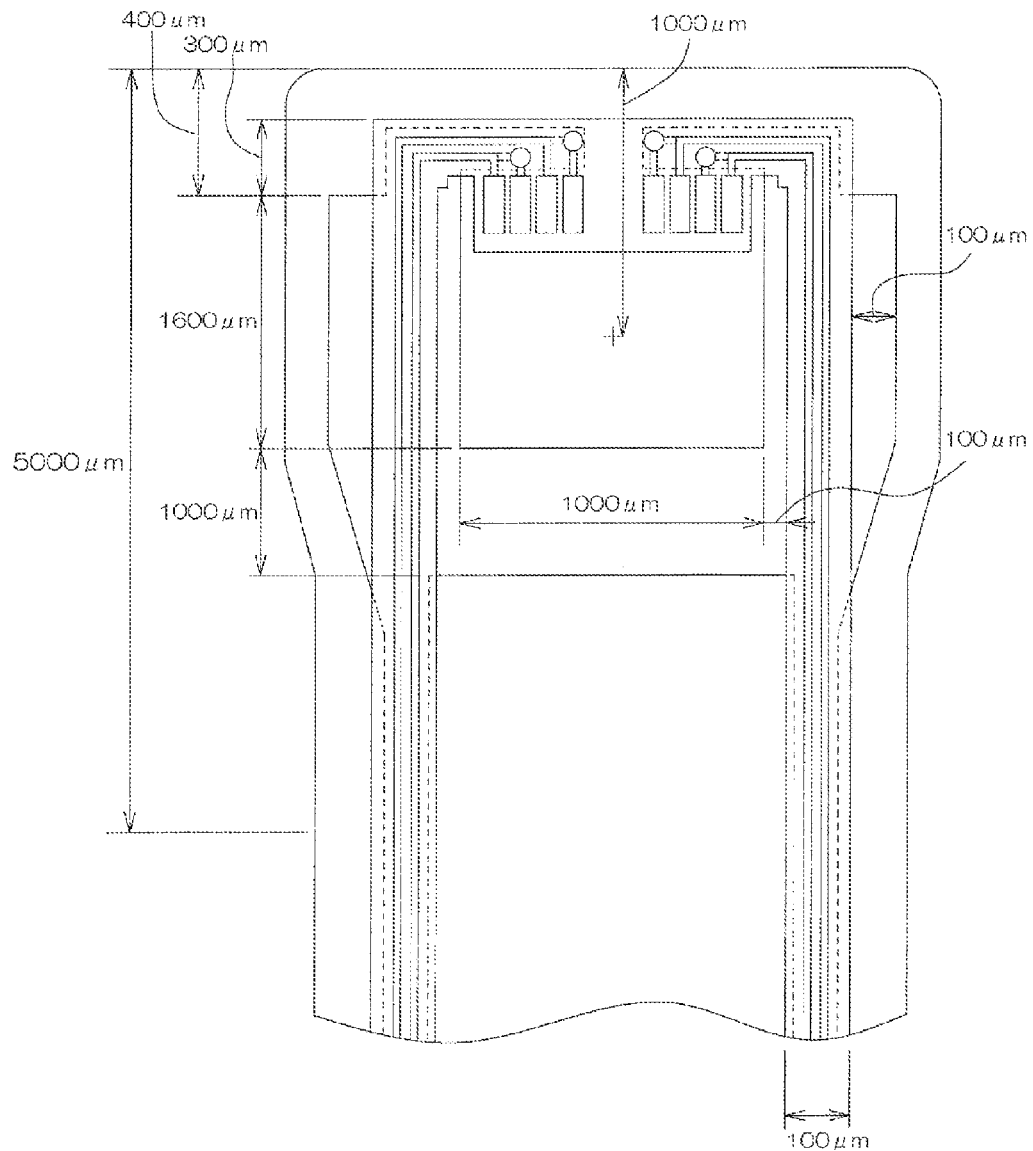
FIG. 14 shows a plan view of the suspension board with circuit in Example 1 and shows dimensions of the metal supporting layer and the insulating base layer.

The amount of displacement was defined as follows. A portion on the rear side of a portion extending 5000 μm from the front end of the suspension board with circuit was fixed so that a portion extending 5000 μm from the front end thereof (the front end portions of the gimbal portion and the wire portion) became a free end (free). In FIG. 14, the amount of displacement at the point that was shown with a + mark (the widthwise central portion that is 1000 μm from the front end, a measurement point) in the tongue portion was defined as the amount of displacement of the tongue portion in the thickness direction.

1. The amount of displacement in the tongue portion was substituted into the following equation to calculate the amount of change in a position angle.

The amount of change in the position angle (deg/% RH)=ATAN (the amount of displacement in the tongue portion/4000)/π×180/70

2. The calculated amount of change in the position angle was evaluated as follows.

A: The amount of change in the position angle (deg/% RH) was below 0.002.

B: The amount of change in the position angle (deg/% RH) was 0.002 or more and below 0.006.

C: The amount of change in the position angle (deg/% RH) was 0.006 or more.

As a result, all the evaluations were A in Examples 1 to 3.

On the other hand, the evaluation in Comparative Example 1 was C.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit comprising:
a metal supporting layer, an insulating layer formed on the metal supporting layer, and a conductive layer formed on the insulating layer, wherein
a gimbal portion is provided in the suspension board with circuit and
an opening penetrating the metal supporting layer in the up-down direction is formed in the gimbal portion, and
the gimbal portion includes
a tongue portion formed at an inner side of the opening for being mounted with a slider mounted with a magnetic head for being electrically connected to the conductive layer,
an outrigger portion formed at an outer side of the opening to support the tongue portion, and
a passing portion passing through the opening of the gimbal portion and/or an outer side region of the outrigger portion, wherein
the passing portion includes the conductive layer and the insulating layer covering the conductive layer, and
the thickness of a lower half portion of the insulating layer in the passing portion is the same as that of an upper half portion thereof.

2. The suspension board with circuit according to claim 1, wherein
a distance between a center in the up-down direction in the passing portion and an upper surface of the upper half portion of the conductive layer is the same as that between the center in the up-down direction in the passing portion and a lower surface of the lower half portion of the conductive layer.

3. The suspension board with circuit according to claim 2, wherein
the insulating layer in the passing portion includes an intermediate insulating layer;
the conductive layer in the passing portion includes
a first conductive layer and
a second conductive layer that is formed on the first conductive layer via the intermediate insulating layer; and
the thickness of the first conductive layer is the same as that of the second conductive layer.

4. The suspension board with circuit according to claim 3, wherein
the insulating layer in the passing portion includes
a first insulating cover layer that is formed below the intermediate insulating layer covering a lower portion of the conductive layer and
a second insulating cover layer that is formed on the intermediate insulating layer covering an upper portion of the conductive layer; and
the lower half portion of the insulating layer consists of the lower half portion of the intermediate insulating layer and the first insulating cover layer, and
the upper half portion of the insulating layer consists of the upper half portion of the intermediate insulating layer and the second insulating cover layer.

5. The suspension board with circuit according to claim 1, wherein
the upper half portion and the lower half portion of the conductive layer in the passing portion are formed to be symmetric with the center in the up-down direction as the center.

6. The suspension board with circuit according to claim 1, wherein
the upper half portion and the lower half portion of the insulating layer in the passing portion are formed to be symmetric with the center in the up-down direction as the center.

7. A method for producing a suspension board with circuit, provided with a gimbal portion including a tongue portion on which a slider mounted with a magnetic head is to be mounted and an outrigger portion that supports the tongue portion,
includes the steps of preparing a metal supporting layer,
forming an insulating layer on the metal supporting layer,
forming a conductive layer on the insulating layer, and
forming, in the metal supporting layer, an opening that corresponds to the conductive layer in the gimbal portion and defines the tongue portion from the outrigger portion, wherein
in the step of forming the insulating layer,
the insulating layer is formed so that the insulating layer covers the conductive layer and the thickness of a lower half portion of the insulating layer in a passing portion passing through the opening and/or an outer side region of the outrigger portion is the same as that of an upper half portion of the insulating layer in the passing portion.

* * * * *